US006737880B2

(12) United States Patent
Samaan et al.

(10) Patent No.: US 6,737,880 B2
(45) Date of Patent: May 18, 2004

(54) DEVICE AND METHOD FOR PROBING INSTANTANEOUS HIGH-SPEED LOCAL SUPPLY VOLTAGE FLUCTUATION IN VLSI INTEGRATED CIRCUITS USING IR EMISSIONS

(75) Inventors: Samie B. Samaan, Lake Oswego, OR (US); Paul Madland, Beaverton, OR (US); Gary L. Woods, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 195 days.

(21) Appl. No.: 09/855,050

(22) Filed: May 14, 2001

(65) Prior Publication Data

US 2002/0167327 A1 Nov. 14, 2002

(51) Int. Cl.[7] ............................................... G01R 31/02

(52) U.S. Cl. ...................... 324/765; 324/752; 250/310; 250/311

(58) Field of Search ................................. 324/751–753, 324/158.1, 765, 769, 754, 763, 750; 250/310, 311

(56) References Cited

U.S. PATENT DOCUMENTS

| | | | | |
|---|---|---|---|---|
| 5,940,545 A | * | 8/1999 | Kash et al. ................. | 324/751 |
| 6,075,908 A | | 6/2000 | Paniccia et al. | |
| 6,111,424 A | | 8/2000 | Bosacchi | |
| 6,375,347 B1 | * | 4/2002 | Bruce et al. .................... | 374/5 |
| 6,417,680 B1 | * | 7/2002 | Birdsley et al. ............ | 324/752 |
| 6,483,327 B1 | * | 11/2002 | Bruce et al. ................ | 324/752 |
| 6,496,022 B1 | * | 12/2002 | Kash et al. ................. | 324/752 |

OTHER PUBLICATIONS

Hungerford et al., *Single–photon Timing Detectors For Fluorescence Lifetime Spectroscopy*, Univ. of Strathclyde, Dept of Physics and Applied Physics, 1995, pp. 121–136.
Kash et al., *Hot Luminescence From CMOS Circuits: A Picosecond Probe of Internal Timing*, IBM Research Division, New York, Nov. 1997, vol. 204, No. 1, pp. 507–516.
Simon M.Sze, *Physics of Semiconductor Devices*, $2^{nd}$ ed., Wiley, John & Sons, Inc., Jan. 1991, p. 439.
Tsang et al., *Picosecond Hot Electron Light Emission From Submicron Complementary Metal–Oxide–Semiconductor Circuits*, Applied Physics Letters, vol. 70, No. 7, Feb. 1997, pp. 889–891.
Tsang et al., *Picosecond Imaging Circuit Analysis*, IBM J. Res. Develop., vol. 44, No. 4, Jul. 2000, pp. 583–603.

* cited by examiner

Primary Examiner—Kamand Cuneo
Assistant Examiner—Jimmy Nguyen
(74) Attorney, Agent, or Firm—Kenyon & Kenyon

(57) ABSTRACT

A device and method for probing high-speed local supply voltage fluctuations in VLSI circuits. The device includes a voltage probe coupled to a source of the local supply voltage, the voltage probe detectably emitting infrared radiation having an intensity that is related to a magnitude of the local supply voltage. The method includes emitting infrared radiation having an intensity that is related to the magnitude of the local supply voltage, taking initial measurements of the emitted radiation intensity for a range of supply voltages while digital activity is suspended in a vicinity of the local voltage probe, and compiling a calibration table matching measured intensity values with a magnitude of the supply voltage. Thereafter, digital activity is initiated by running a repetitive pattern through circuitry in the vicinity of the local voltage probe, where the repetitive pattern stimulates local supply voltage fluctuation events. Samples of emitted radiation intensity are taken using a time correlated photon counting or equivalent time sampling process and local supply voltage fluctuations are determined from the detected radiation.

18 Claims, 7 Drawing Sheets

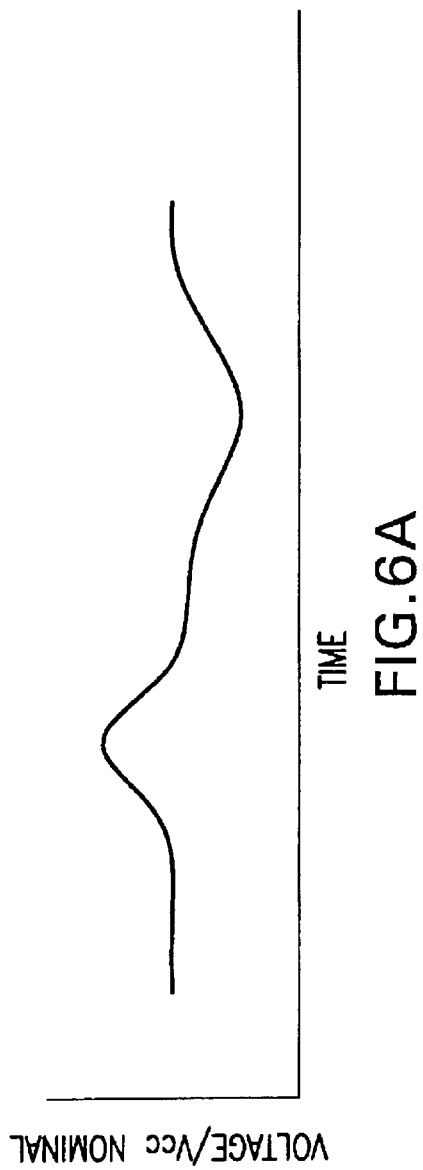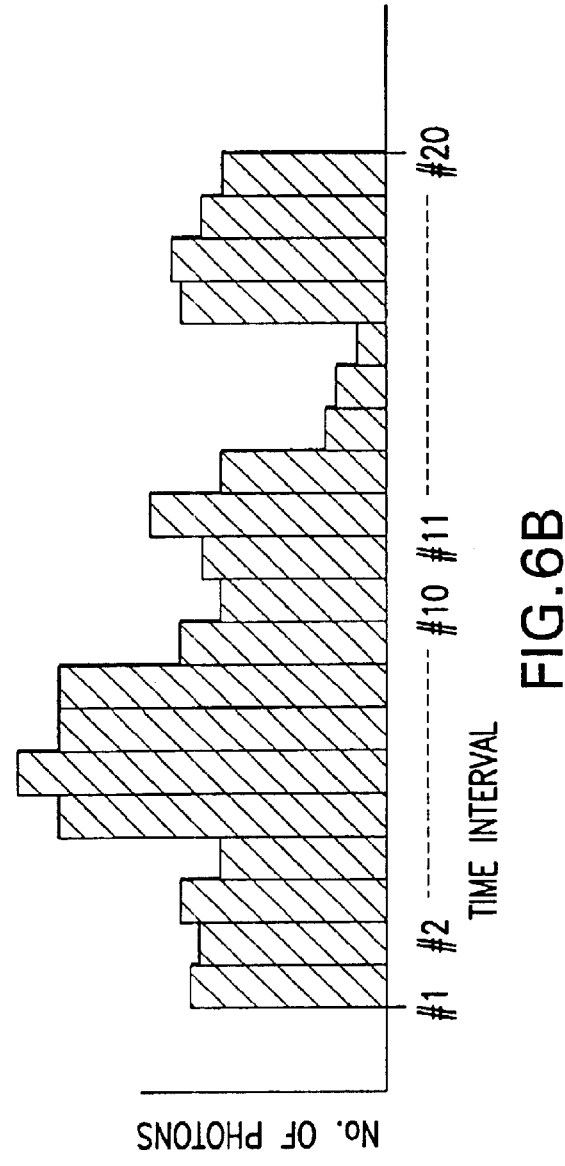

US 6,737,880 B2

DEVICE AND METHOD FOR PROBING INSTANTANEOUS HIGH-SPEED LOCAL SUPPLY VOLTAGE FLUCTUATION IN VLSI INTEGRATED CIRCUITS USING IR EMISSIONS

FIELD OF THE INVENTION

The present invention relates to very large scale integrated (VLSI) circuitry, and in particular relates to a device and method for probing instantaneous high-speed local supply voltage fluctuation in VLSI circuits using infrared emission.

BACKGROUND INFORMATION

As VLSI system clock frequencies increase, cycle times become smaller. Fluctuations in gate delay due to such factors as MOSFET strength variations, temperature fluctuations and local supply voltage variation account for an ever greater proportion of cycle time. These variations, which are accounted for by including extra margins in cycle time during the design process, increasingly limit the design options ("design space") available to engineers.

In particular, gate delay variation due to fluctuations in supply voltage is thought to account, currently, for more than 20 percent of the margin required for maximum delay. While estimates of the magnitude of the instantaneous supply voltage at the drains of MOSFET gates have been deduced based upon knowledge of the physical layout of a typical VLSI circuit, an accurate determination of how supply voltage varies over very short durations has not been made owing to the lack of viable techniques for taking real-time high-speed measurements of supply-voltage variation. An accurate determination may reveal that the margins that have been incorporated as parameters into the design process overestimate the actual supply voltage variation. Consequently, such a determination can lead to a reduction in the budgeted margin and a corresponding widening of the design space. A larger design space, in turn, translates directly into shorter product development cycles and better-targeted product frequencies of operation.

It has been experimentally determined that certain integrated circuit components emit infrared radiation, the intensity of which is functionally related to the supply voltage powering such components. Recent technological advancements in time resolved emission ("TRE") enables time resolution of emission events on a picosecond ($10^{-12}$ s) time scale. These newly developed measurement techniques rely on the dramatic improvement in methods for temporally resolving extremely faint optical signals on extremely short time scales.

BRIEF DESCRIPTION OF THE DRAWINGS

FIG. 6 illustrates an exemplary histogram showing the number of photons detected in each of a set of time intervals using a time correlating photon counting technique.

DETAILED DESCRIPTION

The present invention provides a device and method to probe instantaneous high-speed local variation in supply voltage at the drains of VLSI gates with a timing resolution on the order of 10 picoseconds. In a first embodiment of the voltage probe according to the present invention, a dedicated, spatially isolated n-channel MOSFET (n-FET) device is placed at the localized area of interest. The device is switched on permanently during a test, and radiation emitted from the voltage probe is captured by a detector and the timing of the emission is recorded via a histogram according to a time correlated, photon counting technique (TCPC). The histogram indicates the number of photons detected during individual time intervals. A large number of photons are detected to improve the signal-to-noise ratio of the detected radiation intensity. The record of emitted light intensity versus time is correlated to values of the supply voltage at the drain of the probe using a calibration table which is assembled using predetermined supply voltages.

In a second embodiment of the voltage probe a decoupling capacitor is connected between the supply voltage and ground. In this embodiment, weaker intensity of emissions by the capacitive elements are compensated for by their comparatively greater surface areas.

Figure 1:
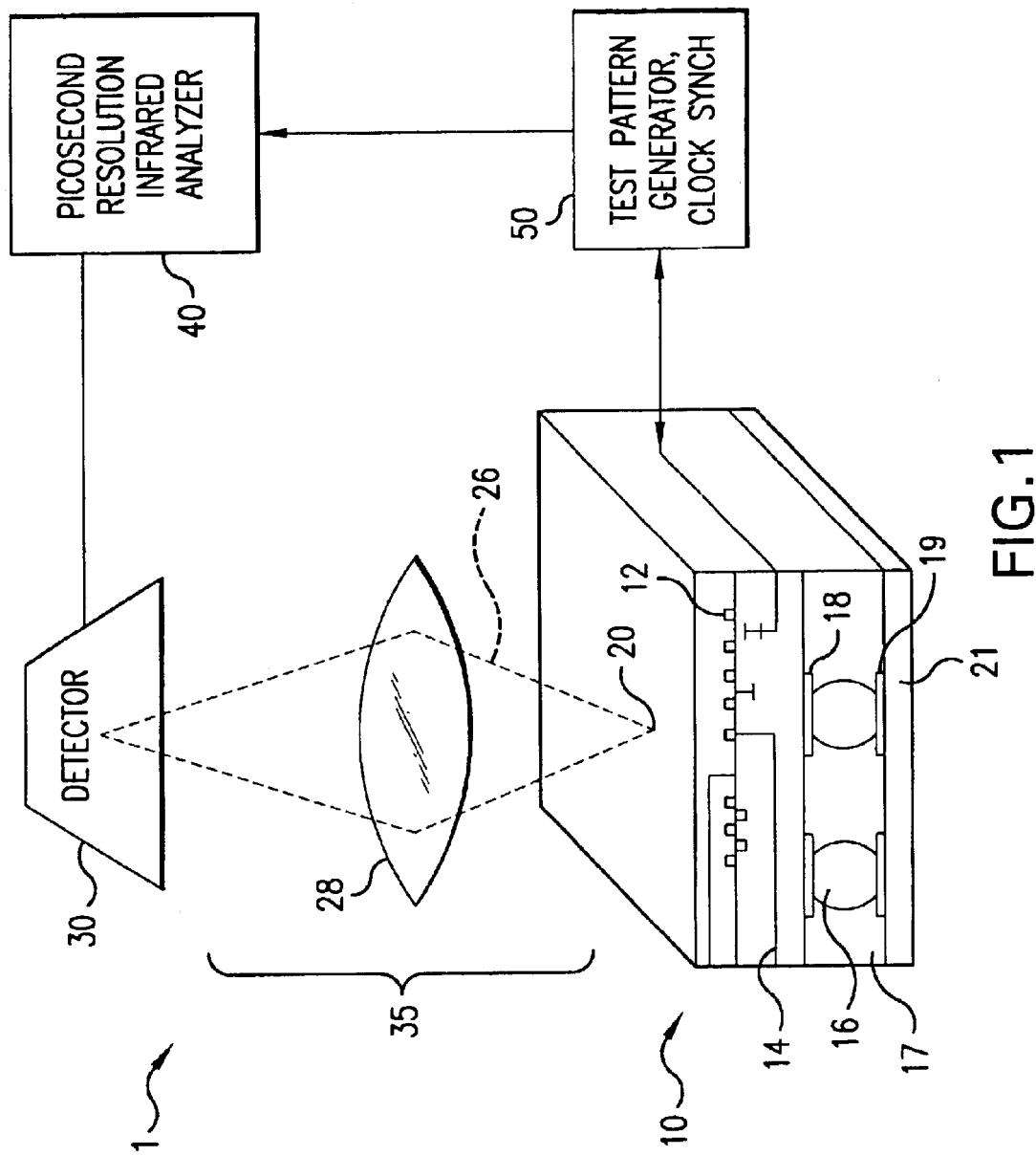
FIG. 1 shows a schematic diagram of an exemplary time resolved emission (TRE) testing system.

FIG. 1 shows a schematic diagram of a TRE testing system 1. In FIG. 1, an exemplary flip-chip packaged integrated circuit IC 10 including multiple layers of metalization is shown. The IC 10 is mounted front-side down on a chip carrier 21. Over the chip carrier 21 lies an epoxy underfill layer 17 that includes solder balls 16 that connect the upper metalized layers 14 to the chip carrier via I/O 18 and substrate pads 19. A silicon substrate layer 12 is situated on the back side of the IC 10 (at the top of the IC shown in FIG. 1). Since the flip-chip packaging (including chip carrier 21) encloses all but the back side of the IC 10, external physical access to the IC can only occur via the silicon substrate layer 12. A local voltage probe 20 is embedded in the silicon substrate layer 12. Although only a single voltage probe 20 is depicted in FIG. 1, it is to be appreciated that numerous voltage probes are arranged throughout the silicon substrate layer 12, and as will be discussed below, each probe indicates supply voltage variation in a particular localized region of the chip.

Because silicon is transparent to light in the infrared spectrum, infrared emissions arising from the voltage probes 20 incorporated in the silicon substrate 12 can penetrate the silicon layer and radiate from the back side of the IC 10. However, due to the fact that when silicon is doped its infrared absorptivity increases, the silicon substrate layer 12 is thinned to approximately 50–200 $\mu$m to decrease absorption and thereby to enhance infrared radiation intensity from the IC 10.

A test pattern generator 50 transmits a digital test pattern to the IC. The transmitted signal is synchronized to the clock cycle of the IC 10 being tested. Depending upon the implementation of the voltage probe, as described below, the local voltage probe 20 may be stimulated to emit radiation. The radiation emitted from the localized voltage probe 20 is incident upon an collection element 28, such as a lens or a mirror, which focuses the radiation onto a photo-detector 30 which may be, for example, an avalanche photomultiplier device sensitive to single photons. To prevent spurious radiation arising from other sources from reaching the detector 30 during testing, various protective shields (schematically shown as a single shield 35) may be used or the system 1 may be situated in a dark chamber. To synchronize the detected events with the IC clock cycle and the test signal, the test pattern generator 50 also transmits a synchronizing signal to the picosecond resolution infrared analyzer 40. The synchronizing signal may include, for example, the IC clock signal and the generated test signal.

Figure 2:
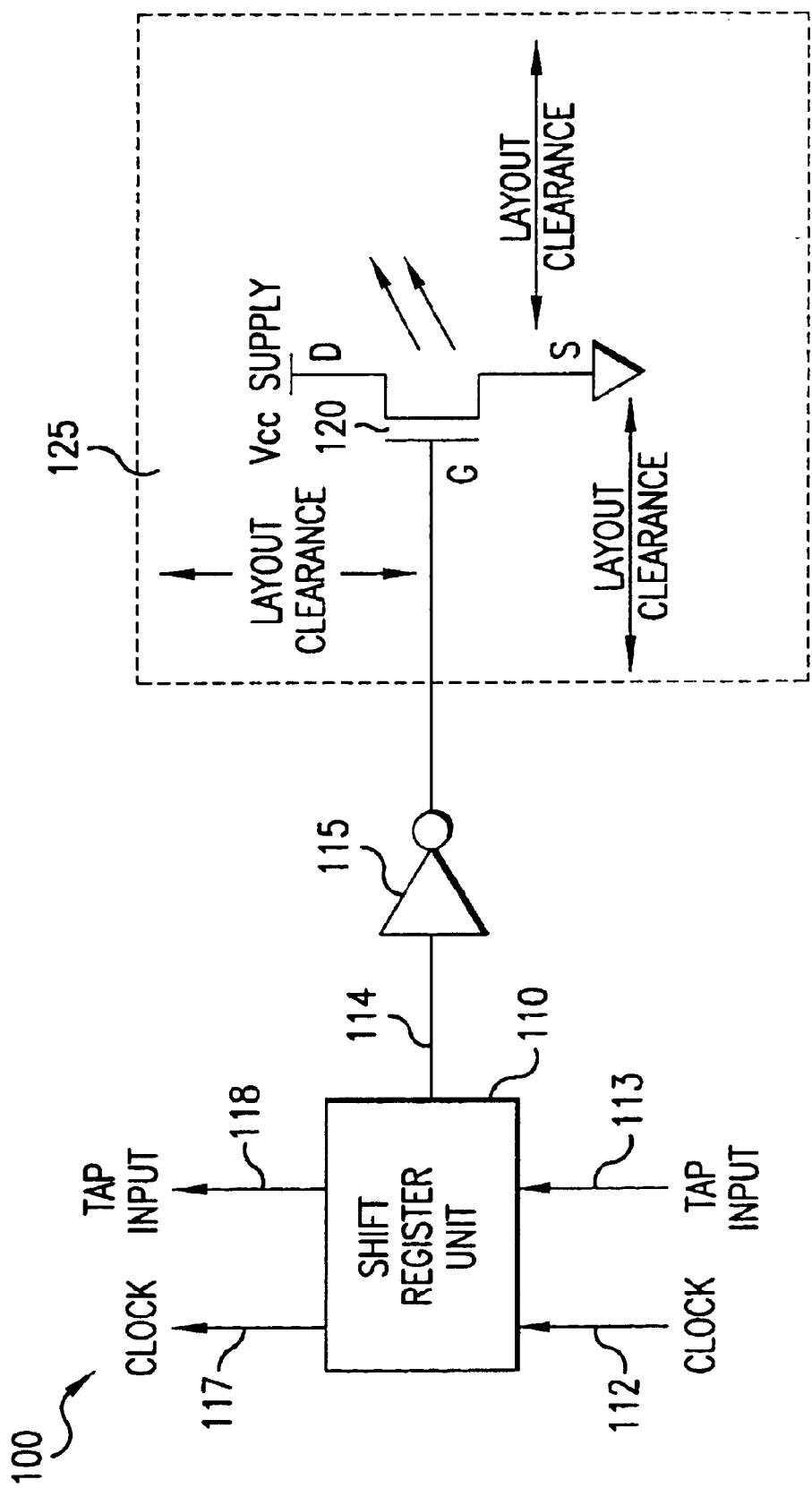
FIG. 2 shows the MOSFET circuit embodiment of the infrared emission voltage probe according to the present invention.

FIG. 2 shows a first embodiment of an infrared emission voltage probe 100. As shown in the figure, a multiply-legged n-channel MOSFET 120 is fed from the voltage supply ($V_{cc}$) intended to be probed. The MOSFET 120 is placed in a layout clearance area 125 and is separated from other circuit components a distance corresponding to the smallest area that can be resolved by the TRE detector 30. Currently, clearance spacing on the order of several microns is possible, but improvements in optical resolution may allow even smaller clearance dimensions.

A test access port shift register element 110 is placed in the vicinity of the MOSFET 120, and its output is used to drive the MOSFET transistor's gate. The shift register element 110 has a clock input 112 and a tap (test access port) pattern input 113. To turn the MOSFET 120 ON, a 0 or 1 (as appropriate) is scanned into the shift register element 110 via the tap pattern input 113. The shift register element 110 also includes outputs 117 and 118 which can supply further shift register elements with the clock signal and the tap pattern, respectively. In this regard, it is to be noted that the numerous shift register elements 110 situated at various separate locations on the IC can be arranged in a daisy-chain relationship in which a single test access port shift register element can drive all or a number of the voltage probes 100 located on the IC chip. Equally, one may use the shift register elements from other pre-existing test access port chains intended for other purposes that may be included in the IC. A switching signal from output 114 of the shift register element 110 is fed to a buffering component 115, and then transmitted to the gate of the MOSFET 120.

The MOSFET 120 can be used as a supply voltage probe because under certain conditions it emits infrared radiation of an intensity that is related to its supply voltage. Within the conduction channel of the MOSFET, a portion of the electrons, termed "hot" electrons, are given higher kinetic energies due to the presence of an applied electric field when the FET is "ON" or in saturation. Accordingly, the energy distribution of the hot electrons widens and intensifies when a greater electric field is applied. When the hot electrons scatter in contact with other electrons or the semiconductor lattice or defects, the electrons 'relax' into lower energy states and photons in the infrared region of the spectrum are simultaneously emitted. The scattering rates are sufficiently high that the relaxation occurs on subpicosecond time scales, allowing the distribution of hot electrons and the associated light emission to respond essentially instantaneously to changes in the electric fields and currents that occur on the picosecond time scales characteristic of modern integrated circuits.

Figure 3:
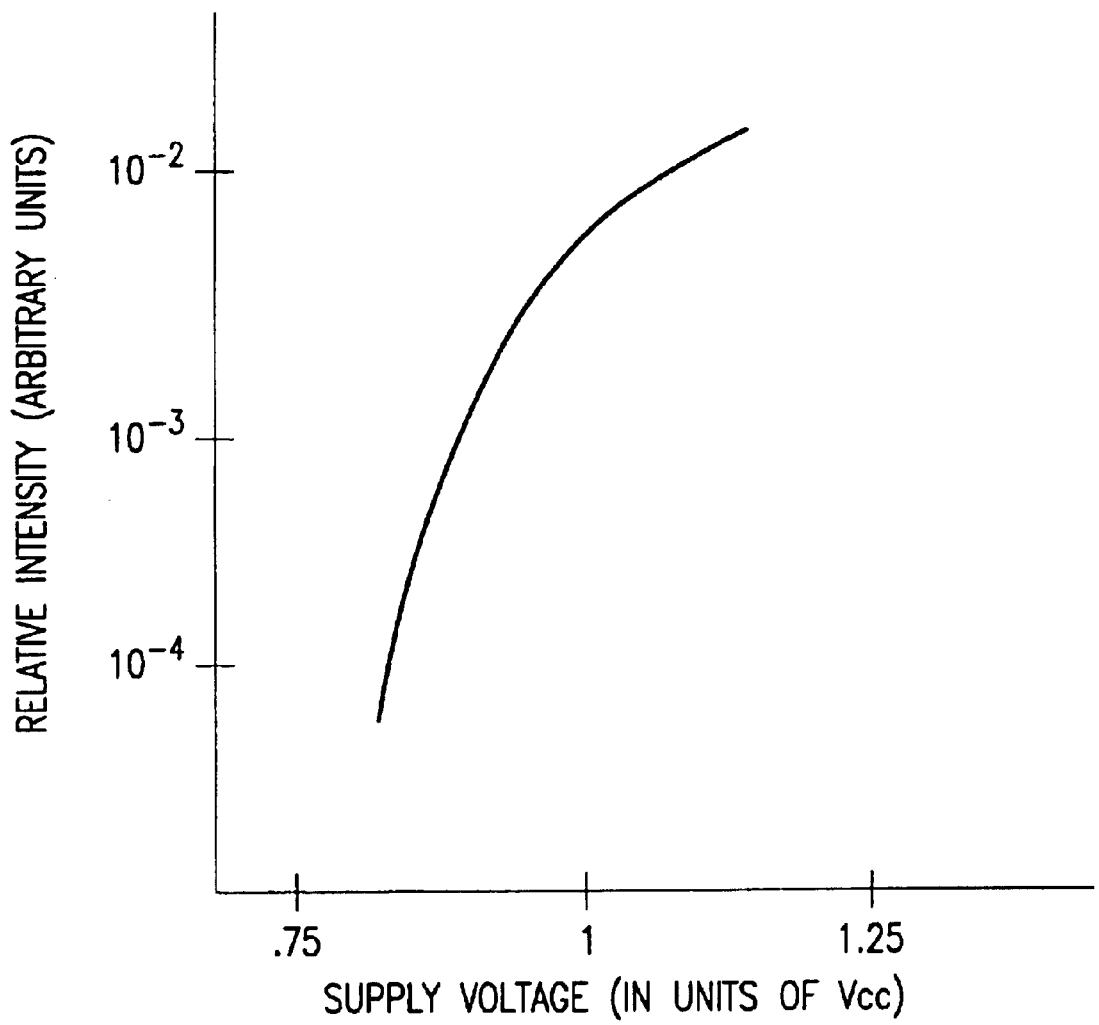
FIG. 3 shows a graph illustrating the relationship between emission intensity and supply voltage.

The intensity of light, which is proportional to the number of hot electrons generated in the MOSFET 120, is a function of both the source-to-drain voltage, i.e., the supply voltage $V_{cc}$ and the gate voltage supplied from the shift register element 110. If the gate voltage is kept constant during an ON state, the intensity of the emission is approximately related to $V_{cc}$ according to the equation $$\text{Intensity} = K \exp(-c/Vcc) \tag{1}$$

where K and c are constants. If K and c are determined experimentally, the supply voltage $V_{cc}$ can be deduced from measurements of emission intensity. Since the black body temperature equivalent of a $V_{cc}$ of 1V is on the order of 2000° K, the emission intensity is largely independent of the Silicon lattice temperature of the MOSFET channel. A graph illustrating the relationship (on a logarithmic scale) between emission intensity and $V_{cc}$ is shown in FIG. 3.

Figure 4:
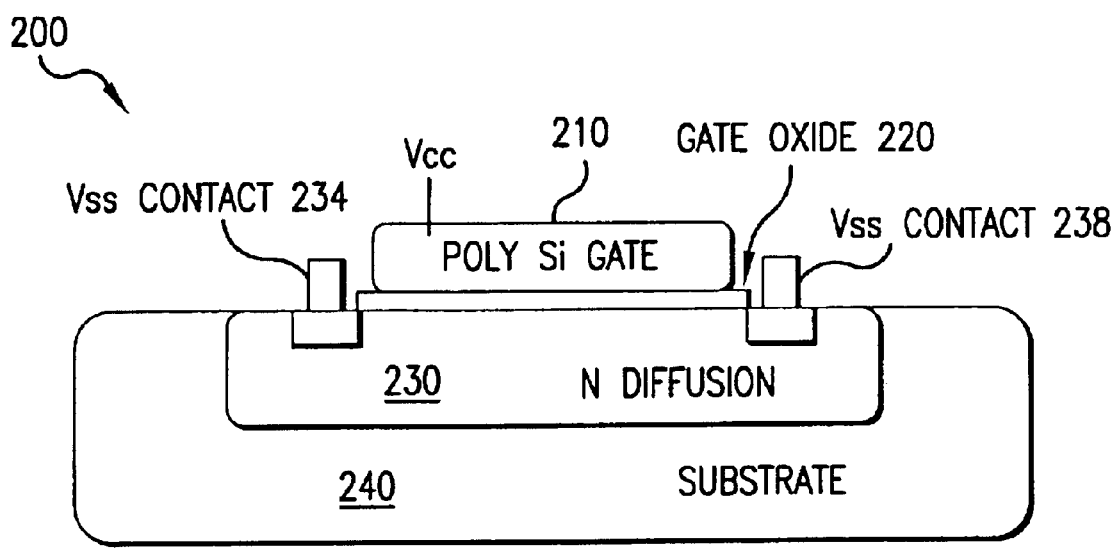
FIG. 4 shows the decoupling capacitor embodiment of the infrared emission voltage probe according to the present invention.

In a second embodiment of the voltage probe, a decoupling capacitor is used as the emission source. The typical density of hot electrons in the decoupling capacitor is lower than can be achieved using the MOSFET embodiment 100, however, the area of the decoupling capacitor, which is orders of magnitude larger than the area of a MOSFET channel, compensates for the lower carrier density. A schematic illustration of the decoupling capacitor voltage probe 200 is shown in FIG. 4. As shown, a polysilicon layer 210 built from gate polysilicon is layered on top of a gate oxide layer 220. The gate oxide layer is in turn arranged upon an N diffusion layer 230 composed of doped silicon within silicon substrate 240. Contact pins 234, 238 are arranged on either side of the gate oxide layer 220 and are coupled to the N diffusion layer. The supply voltage $V_{cc}$ is coupled to the polysilicon layer 210.

Both the upper polysilicon layer 210 and the N diffusion layer can be considered as the plates of a capacitor which are separated from each other by a dielectric oxide layer 220. Such capacitive arrangements are used in integrated circuits as decouplers to protect circuit components from sudden spikes in voltage and current supply. During operation, after the polysilicon layer 210 charges up to $V_{cc}$, a tunneling or leakage current begins to flow through the oxide layer 220. Within the oxide layer, tunneling electrons accelerate in the presence of the electric field between the plate layers 210, 230 and emit infrared radiation as a result of their acceleration and subsequent deceleration. The intensity of the emission is a function of the strength of the voltage $V_{cc}$ supplied across the capacitor 200.

The temporal behavior of the emission from the decoupling capacitor 200 is as fast that of hot electron emission in the MOSFET embodiment 100. It therefore tracks the supply voltage on a time scale in the range of approximately a few picoseconds. Thus, an accurate time domain waveform may be obtained at a decoupling capacitor 200 without the need for a special circuit.

Figure 5:
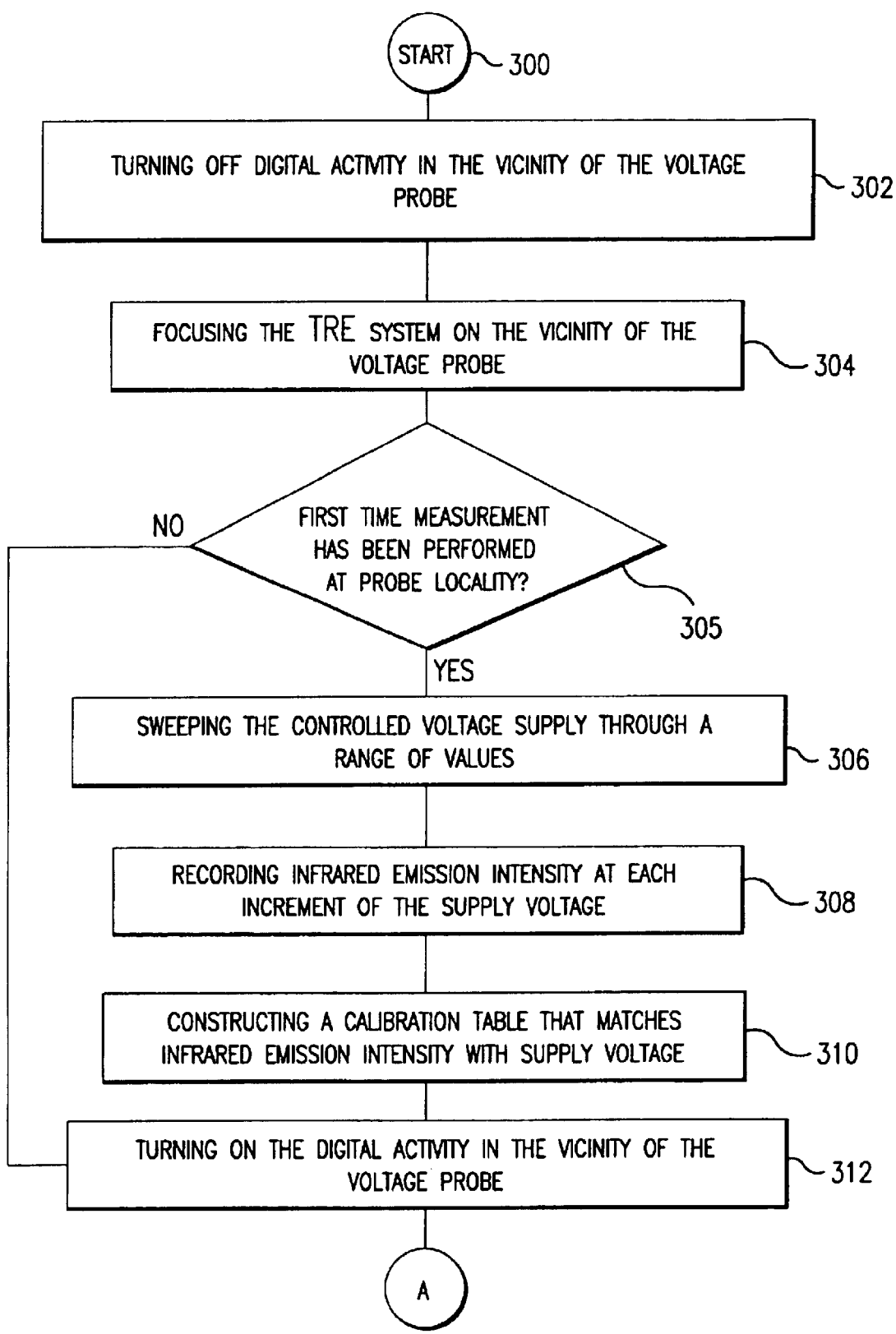
FIGS. 5 and 5A show a flow chart of the probing method using the MOSFET circuit according to the present invention.
Figure 5A:
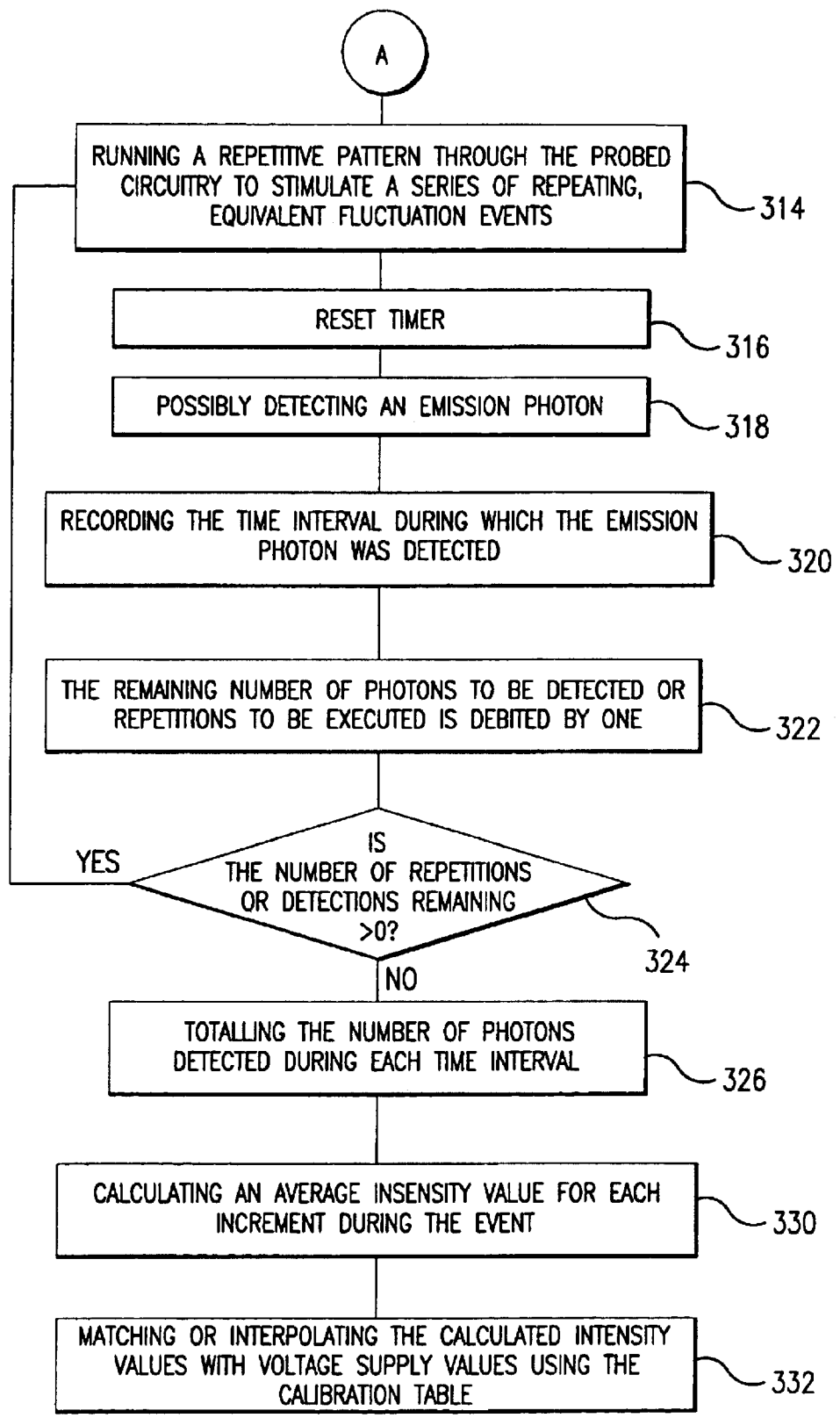

A method of probing local high-speed supply voltage fluctuations is described with reference to FIG. 5 and FIG. 5A. Initially, in order to accurately probe the supply voltage, the emission intensity is pre-calibrated to the supply voltage by constructing a calibration table. In step 300 the probing method begins. In step 302, the digital activity in the vicinity of the voltage probe is turned off by stopping the chip's clock distribution in the area. If the first embodiment of the voltage probe is used, the MOSFET is turned ON into a saturated state using an appropriate tap pattern. In step 304, the optical light collection components of the TRE testing system are adjusted to focus on the voltage probe of interest and to obtain infrared intensity measurements. If there have been no previous measurements at the probe location (step 305), then in step 306, the supply voltage $V_{cc}$ is coupled to a direct current voltage source through which the supply voltage can be controlled and gradually swept in defined increments. According to an implementation, the supply voltage is swept from approximately 70 percent up to 120 percent of the nominal voltage value. At each increment, the infrared emission from the voltage probe is recorded via measurements of photon emission rates (step 308) and a table is constructed (step 310) that establishes a correspondence between a particular value of the supply voltage and an emission intensity value.

After completion of the calibration table, the digital activity of the IC is turned on (step 312) and a repetitive pattern is run through the probed circuitry (step 314) in order to stimulate equivalent supply voltage fluctuation events numerous times in a regular temporal pattern. A time correlated photon counting technique is used to determine the timing of emission events associated with the supply voltage fluctuations. For illustrative purposes it is assumed that the repetitive pattern causes a supply voltage fluctuation event that occurs over approximately 200 picoseconds. Although this time scale is typical for such events, the method described applies equally to events of shorter and longer duration. Since the time resolution of present TRE analyzer systems is on the order of 10 picoseconds, the 200 picosecond event can be divided into twenty (20) time intervals of 10 ps in duration, numbered 1 through 20. Because the TRE system is synchronized to the chip clock, the timing of emission detection can be resolved precisely relative to the occurrence of the fluctuation events. For example, after a timer at time t=0 starts running (step 316), a first stimulated event an initial infrared emission may be detected (step 318) approximately 75 picoseconds later during time interval #8. Because photons are not normally detected for every voltage supply fluctuation event, the stimulating pattern is repeated a predetermined number of times (up to a threshold number) to allow a sufficient number of emission photons to be detected. If, during a pattern execution, a photon emission is detected, the time interval during which the detection occurs is recorded (step 320). The remaining number of photons to be detected or repetitions to be executed is debited by one (step 322). If the number of remaining detections or repetitions is greater than zero (step 324), the event is repeated (step 314) and the timer is reset (step 316). A successive emission detection may be made during, for example, time interval #3. After a series of detections, the number of photons detected in each time interval is totaled (step 326) and can be displayed graphically as a histogram (shown in FIG. 6). An average intensity value can be calculated (step 330) from the number of photons detected in each increment, and this intensity value can then be matched with voltage supply values (step 332) using the calibration table. Accordingly as FIG. 6, which shows both supply voltage versus time (top) and the histogram of the number of photons detected (bottom), the photon emission pattern displayed in the histogram accurately indicates the timing and strength of voltage supply fluctuation events.

In an alternative implementation, an equivalent time sampling (ETS) technique may be used in place of or in addition to TCPC. In ETS, a photon-emission sample is taken in a single time interval for each repetition of the voltage fluctuation pattern. With each successive repetition the sample is taken at a later time interval in the pattern. In this manner, samples are taken at each time-interval of the repetitive pattern, and a relationship of emission intensity versus time interval is determined.

In the foregoing description, the method and system of the invention have been described with reference to a number of examples that are not to be considered limiting. Rather, it is to be understood and expected that variations in the principles of the method and apparatus herein disclosed may be made by one skilled in the art and it is intended that such modifications, changes, and/or substitutions are to be included within the scope of the present invention as set forth in the appended claims. For example, it is to be appreciated that in a given implementation of the first embodiment of the voltage probe, p-channel MOSFETs may be used, however, the intensity of infrared radiation emitted by p-channel MOSFETs is generally lower than that of n-channel MOSFETs.

What is claimed is:

1. An apparatus, comprising:

a voltage probe incorporated in a VLSI integrated circuit and coupled to a source of a local supply voltage, the voltage probe detectably emitting infrared radiation for probing instantaneous high-speed fluctuations of the local supply voltage in the integrated circuit, the radiation having an intensity that is related to a magnitude of the local supply voltage.

2. The apparatus of claim 1, wherein the voltage probe includes:

a MOSFET device having a gate, a source and a drain; and a switching device coupled to the gate of the MOSFET device, the switching device selectively switching the MOSFET device to a saturated state during which the MOSFET device emits infrared radiation;

wherein the drain of the MOSFET device is coupled to the local supply voltage.

3. The apparatus of claim 1, wherein the voltage probe includes a decoupling capacitor.

4. An apparatus, comprising:

a MOSFET device having a gate, a source and a drain, the MOSFET device being incorporated in an integrated circuit and coupled via the drain to a local supply voltage, the MOSFET device detectably emitting infrared radiation for probing instantaneous high-speed fluctuations of the local supply voltage in the integrated circuit, the radiation having an intensity that is related to a magnitude of the local supply voltage; and a switching device coupled to the gate of the MOSFET device, the switching device selectively switching the MOSFET device to a saturated state during which the MOSFET device emits infrared radiation.

5. The apparatus of claim 4, wherein the MOSFET device is an n-channel MOSFET.

6. The apparatus of claim 4, wherein the switching device includes a shift register element, the shift register element outputting a switching signal to the gate of the MOSFET device.

7. The apparatus of claim 6, further comprising:

a buffering device situated between and coupled to both the shift register element and the gate of the MOSFET device, the buffering device receiving the switching signal from the shift register element and buffering the switching signal before transmitting a buffered switching signal to the gate of the MOSFET device.

8. The apparatus of claim 7, wherein the MOSFET device is surrounded by a layout clearance area, the layout clearance area being devoid of active circuit components.

9. An apparatus, comprising:

a decoupling capacitor incorporated in an integrated circuit and coupled to a source of the local supply voltage, the decoupling capacitor detectably emitting infrared radiation for probing instantaneous high-speed fluctuations of a local supply voltage in the integrated circuit, the radiation having an intensity that is related to a magnitude of the local supply voltage.

10. The apparatus of claim 9, wherein the decoupling capacitor includes a polysilicon layer, a gate oxide layer having a first side situated adjacent to the polysilicon layer, and a further silicon layer situated adjacent to a second side of the gate oxide layer, the local supply voltage being coupled to the polysilicon layer.

11. A method for probing instantaneous high-speed fluctuations of a local supply voltage in a VLSI integrated circuit, the method comprising:

emitting infrared radiation using a local voltage probe, the radiation having an intensity that is related to a magnitude of the local supply voltage;

initiating digital activity by running a repetitive pattern through circuitry in the vicinity of the local voltage probe, the repetitive pattern stimulating local supply voltage fluctuation events;

sampling emitted radiation intensity using time correlated photon counting; and determining local supply voltage fluctuation as a function of the sampled emitted radiation intensity;

wherein the sample times are synchronized to a clock cycle of the integrated circuit.

12. The method of claim 11, further comprising:

if no measurements have yet been taken using the voltage probe at a vicinity, taking initial measurement of emitted radiation intensity for a range of local supply voltages while digital activity is suspended in a vicinity of the local voltage probe; and compiling a calibration table in which measured intensity values are correlated with respective magnitudes of the local supply voltage.

13. The method of claim 12, wherein the initial measurements are taken in a range of from 70 percent to 120 percent of a regular supply voltage.

14. The method of claim 11, wherein the local voltage probe includes a MOSFET device for infrared emission.

15. The method of claim 11, wherein the local voltage probe includes a decoupling capacitor for infrared emission.

16. The method of claim 11, further comprising:

detecting a series of samples of emitted radiation, each successive sample being taken for a single repetition of the repetitive pattern during a time interval correlated with the repetitive pattern;

repeating the recordation of a series of samples for numerous iterations; and totaling the samples detected for each time interval.

17. The method of claim 11, wherein measurements of emitted radiation intensity are made using a time resolved emission system.

18. The method of claim 14, further comprising:

inputting a tap pattern to turn the MOSFET device ON into a saturated state.

* * * * *